(12) United States Patent
Cho et al.

(10) Patent No.: US 12,249,588 B2
(45) Date of Patent: Mar. 11, 2025

(54) SEMICONDUCTOR DEVICE AND METHODS OF MANUFACTURE

(71) Applicant: Taiwan Semiconductor Manufacturing Co., Ltd., Hsinchu (TW)

(72) Inventors: Hung-Chun Cho, Hsinchu (TW); Hung-Jui Kuo, Hsinchu (TW); Yu-Hsiang Hu, Hsinchu (TW); Sih-Hao Liao, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 6 days.

(21) Appl. No.: 18/182,470

(22) Filed: Mar. 13, 2023

(65) Prior Publication Data
US 2023/0215831 A1    Jul. 6, 2023

Related U.S. Application Data

(62) Division of application No. 17/206,442, filed on Mar. 19, 2021, now Pat. No. 11,605,607.

(51) Int. Cl.
*H01L 23/00*    (2006.01)
*H01L 23/29*    (2006.01)
(Continued)

(52) U.S. Cl.
CPC ............ *H01L 24/20* (2013.01); *H01L 23/295* (2013.01); *H01L 23/296* (2013.01); *H01L 24/19* (2013.01); *H01L 24/82* (2013.01); *H01L 24/96* (2013.01); *H01L 25/0652* (2013.01); *H01L 25/18* (2013.01); *H01L 25/50* (2013.01); *H01L 21/561* (2013.01); *H01L 24/73* (2013.01); *H01L 2224/19* (2013.01); *H01L 2224/21* (2013.01); *H01L 2224/2101* (2013.01); *H01L 2224/24105* (2013.01); *H01L 2224/24146* (2013.01); *H01L 2224/73204* (2013.01);
(Continued)

(58) Field of Classification Search
CPC .......... H01L 24/19–20; H01L 2224/19; H01L 2224/21; H01L 2224/2101; H01L 2224/82051
See application file for complete search history.

(56) References Cited

U.S. PATENT DOCUMENTS

| | | |
|---|---|---|
| 5,600,151 A | 2/1997 | Adachi et al. |
| 2014/0349105 A1 | 11/2014 | Yamazaki et al. |
| 2015/0166847 A1* | 6/2015 | Morita .............. H01L 24/29 252/500 |

FOREIGN PATENT DOCUMENTS

TW    M589897 U    1/2020

* cited by examiner

Primary Examiner — Tucker J Wright
(74) Attorney, Agent, or Firm — Slater Matsil, LLP

(57) ABSTRACT

In an embodiment, a method includes forming a conductive feature adjacent to a substrate; treating the conductive feature with a protective material, the protective material comprising an inorganic core with an organic coating around the inorganic core, the treating the conductive feature comprising forming a protective layer over the conductive feature; and forming an encapsulant around the conductive feature and the protective layer. In another embodiment, the method further includes, before forming the encapsulant, rinsing the protective layer with water. In another embodiment, the protective layer is selectively formed over the conductive feature.

20 Claims, 12 Drawing Sheets

(51) Int. Cl.
    *H01L 25/00*     (2006.01)
    *H01L 25/065*     (2023.01)
    *H01L 25/18*     (2023.01)
    *H01L 21/56*     (2006.01)

(52) U.S. Cl.
    CPC ............... *H01L 2224/73259* (2013.01); *H01L 2224/73267* (2013.01); *H01L 2224/82051* (2013.01)

SEMICONDUCTOR DEVICE AND METHODS OF MANUFACTURE

PRIORITY CLAIM AND CROSS-REFERENCE

This application is a divisional of U.S. patent application Ser. No. 17/206,442, filed on Mar. 19, 2021, entitled "Semiconductor Device and Methods of Manufacture," which is incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
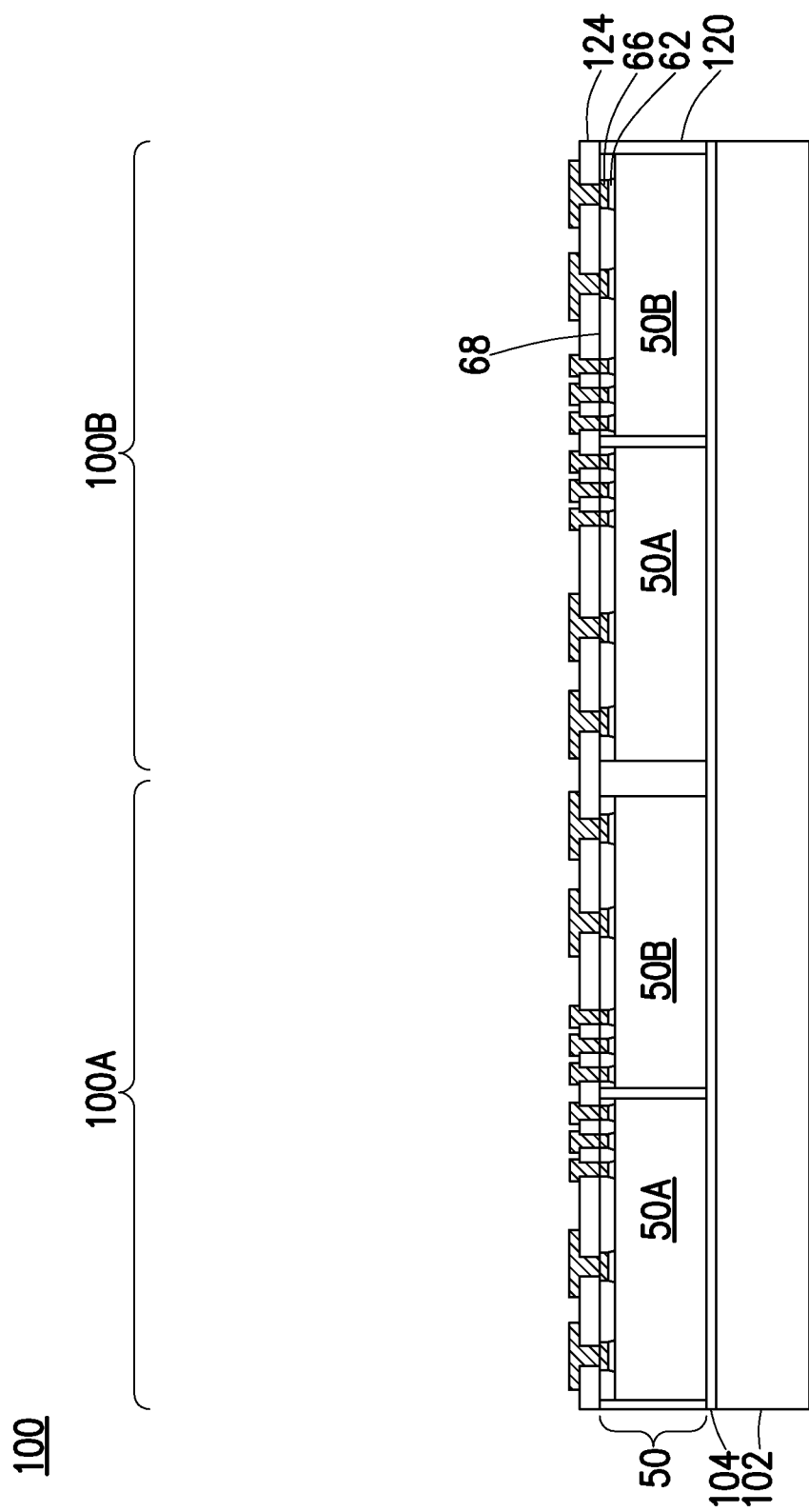
FIGS. 1 through 4 and 6 through 12 illustrate cross-sectional views of intermediate steps during processes for forming integrated circuit packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, formation of an integrated circuit package includes conductive features (e.g., under-bump metallurgy layers and through vias) and an encapsulant within integrated fan-out (InFO) for large scale integration (LSI) technology. The embodiments include a treatment for the conductive features to improve adhesion between the conductive features and the subsequently formed encapsulant. The treatment forms a protective layer over the conductive features, further providing protection from oxidation of the conductive features. The encapsulant is then formed over and around the protective layer and planarized to expose the conductive features. A redistribution structure and connectors may be formed over the conductive features and the encapsulant in order to be attached to one or more other semiconductor packages. As a result of the disclosed embodiments, delamination between the conductive features, the protective layer, and the encapsulant—during various processes (e.g., planarization) and functional use of the completed integrated circuit package—is prevented or reduced. Because of these improvements, lower cost, higher efficiency, and increased yield of integrated circuit packages during subsequent fabrication processing and greater reliability and robustness during functional use of the integrated circuit packages are achieved.

FIGS. 1 through 4 and 6 through 11 illustrate cross-sectional views of intermediate steps during a process for forming an integrated circuit package 100, in accordance with some embodiments. A first package region 100A and a second package region 100B are illustrated, and one or more integrated circuit dies 50 are packaged to form an integrated circuit package 100 in each of the package regions 100A and 100B. The integrated circuit packages may also be referred to as integrated fan-out (InFO) packages.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

In some embodiments, integrated circuit dies 50 (e.g., a first integrated circuit die 50A and a second integrated circuit die 50B) are adhered to the release layer 104 by an adhesive (not illustrated). A desired type and quantity of integrated circuit dies 50 are adhered in each of the package regions 100A and 100B. In the embodiment shown, multiple integrated circuit dies 50 are adhered adjacent to one another, including the first integrated circuit die 50A and the second integrated circuit die 50B in each of the first package region 100A and the second package region 100B. The first integrated circuit die 50A may be a logic device, such as a central processing unit (CPU), a graphics processing unit (GPU), a system-on-a-chip (SoC), a microcontroller, or the like. The second integrated circuit die 50B may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas).

The integrated circuit dies 50 include pads 62, such as aluminum pads, to which external connections are made. The pads 62 are on the active side of the integrated circuit dies 50, such as in and/or on an interconnect structure. Die connectors 66, such as conductive pillars (for example, formed of a metal such as copper) are physically and electrically coupled to respective ones of the pads 62. The die connectors 66 may be formed by, for example, plating, or the like. The die connectors 66 electrically couple the respective integrated circuits of the integrated circuit dies 50.

Optionally, solder regions (e.g., solder balls or solder bumps) may be disposed on the pads 62. The solder balls may be used to perform chip probe (CP) testing on the integrated circuit dies 50. CP testing may be performed on the integrated circuit dies 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit dies 50. The dielectric layer 68 laterally encapsulates the die connectors 66. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit dies 50. In some embodiments, the die connectors 66 remain buried and are exposed during a subsequent process for packaging the integrated circuit dies 50. Exposing the die connectors 66 may remove any solder regions that may be present on the die connectors 66.

In some embodiments, the integrated circuit dies 50 are stacked devices that include multiple semiconductor substrates. For example, the integrated circuit dies 50 may be a memory device such as an HMC module, an HBM module, or the like that includes multiple memory dies. In such embodiments, the integrated circuit dies 50 may include multiple semiconductor substrates interconnected by through-substrate vias (TSVs). Each of the semiconductor substrates may (or may not) have an interconnect structure.

Optionally, an adhesive (not shown) may be on back-sides of the integrated circuit dies 50 in order to adhere the integrated circuit dies 50 to the over the surface of the carrier substrate 102, such as over the release layer 104. The adhesive may be any suitable adhesive, epoxy, die attach film (DAF), or the like. The adhesive may be applied to back-sides of the integrated circuit dies 50 or over the surface of the carrier substrate 102 (e.g., over the release layer 104). For example, the adhesive may be applied to the back-sides of the integrated circuit dies 50 before singulating to separate the integrated circuit dies 50.

In addition, an encapsulant 120 is placed on and around the various components. After formation, the encapsulant 120 encapsulates the integrated circuit dies 50. The encapsulant 120 may be a molding compound, epoxy, or the like. The encapsulant 120 may be applied by compression molding, transfer molding, or the like, and may be formed over the carrier substrate 102 such that the integrated circuit dies 50 are buried or covered. The encapsulant 120 is further formed in gap regions between the integrated circuit dies 50. The encapsulant 120 may be applied in liquid or semi-liquid form and then subsequently cured.

In some embodiments, a planarization process may be performed on the encapsulant 120 to expose the die connectors 66. The planarization process may also remove material of the dielectric layer 68 and/or the die connectors 66 until the die connectors 66 are exposed. Top surfaces of the die connectors 66, the dielectric layer 68, and the encapsulant 120 are substantially coplanar after the planarization process within process variations. The planarization process may be, for example, a chemical-mechanical polish (CMP) process, a grinding process, or the like. In some embodiments, the planarization may be omitted, for example, if the die connectors 66 are already exposed.

Still referring to FIG. 1, a dielectric layer 124 is deposited on the integrated circuit dies 50, and the encapsulant 120. In some embodiments, the dielectric layer 124 may be formed of a photo-sensitive material such as PBO, polyimide, BCB, cyclic olefin copolymer, acryl-based copolymer, or the like, which may be patterned using a lithography mask. The dielectric layer 124 may be formed by spin coating, lamination, CVD, the like, or a combination thereof. The dielectric layer 124 is then patterned. The patterning forms openings exposing portions of the die connectors 66. The patterning may be performed by an acceptable process, such as by exposing and developing the dielectric layer 124 to light when the dielectric layer 124 is a photo-sensitive material, or by etching using, for example, an anisotropic etch.

Under-bump metallurgy layers (UBMLs) 126 are then formed in the openings for connection to higher layers of the integrated circuit package 100. The UBMLs 126 have bump portions on and extending along the major surface of the dielectric layer 124 and via portions extending through the dielectric layer 124 to physically and electrically couple the UBMLs 126 to the integrated circuit dies 50. As an example to form the UBMLs 126, a seed layer (not shown) is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMLs 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the UBMLs 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 2:
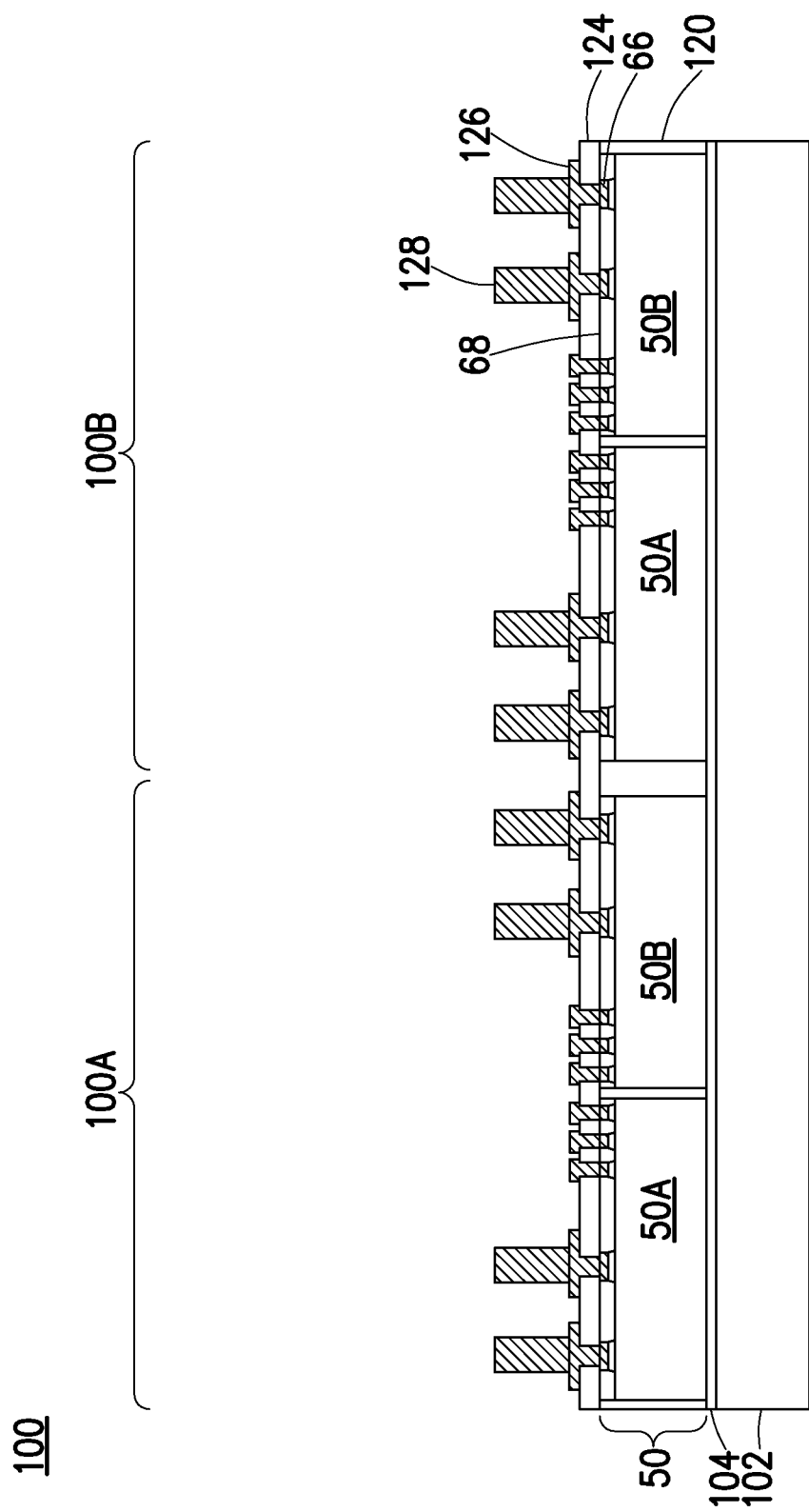

In FIG. 2, through vias 128 are formed over and electrically coupled to the UBMLs 126. Note that some of the UBMLs 126 may remain free of the through vias 128. In some embodiments, a seed layer (not shown) is first deposited over the UBMLs 126 and the dielectric layer 124. The seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist (not shown) is then applied over the seed layer, the UBMLs 126, and the dielectric layer 124, and fills the regions between the UBMLs 126.

The photoresist, once cured and dried, may be patterned by placing the structure (e.g., the carrier substrate 102 and the photoresist) in a photoresist imaging device (not shown) for exposure. The photoresist imaging device supplies photoresist energy, such as light, to portions of the photoresist controlled by a pattern mask (not shown) located between the photoresist energy supply and the photoresist, in order to induce a reaction in the photoresist to chemically alter those portions of the photoresist to which the photoresist energy impinges and that are not blocked by the pattern mask. Portions of the photoresist may then be removed, thereby leaving openings in which the through vias 128 will be formed.

A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 128. In some embodiments, the through vias 128 are formed of a material, such as copper, that may oxidize. For example, the through vias 128 may readily form a surface layer (not shown) comprising a metal oxide.

Figure 3:
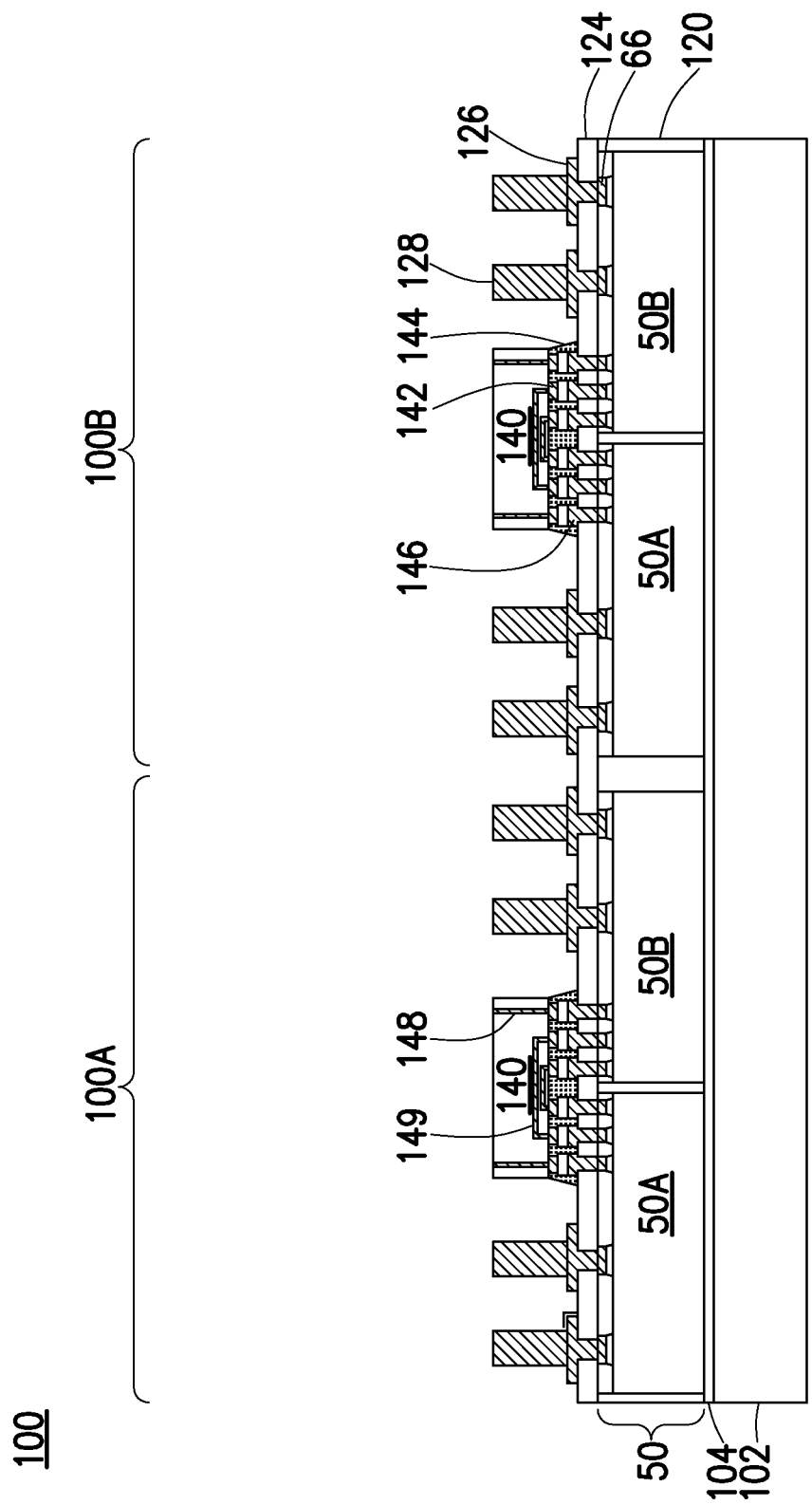

In FIG. 3, integrated component packages 140, such as local silicon interconnects or large scale integration packages, are attached to the integrated circuit package 100 utilizing die connectors 142 included along the front-side of the integrated component packages 140. Some of the die connectors 142 may be electrically coupled to the back-side of the integrated component packages 140 using through silicon vias (TSVs) 148. In some embodiments, the TSVs 148 are exposed, as illustrated. In other embodiments not illustrated, a dielectric material of the integrated component packages 140 may be covering the TSVs 148.

In embodiments in which the integrated component packages 140 are local silicon interconnects, the integrated component packages 140 may comprise die bridges 149. The die bridges 149 may be metallization layers formed over, e.g., a silicon substrate, and work to interconnect one die connector 142 to another die connector. As such, the local silicon interconnects can be used to directly connect and allow communication between the integrated circuit dies 50A and 50B.

In some embodiments, the integrated component packages 140 may further include electronic components and/or memory devices (e.g., memory chips or memory packages). In some embodiments, the integrated component packages 140 may include a central processing unit (CPU), field programmable gate array (FPGA), microcontrollers, and the like. In some embodiment, the electronic components may be memory devices such as high bandwidth memories (HBM), dynamic random access memories (DRAM), static random access memories (SRAM) and the combination thereof. In some alternative embodiments, the electronic components may be a graphical processing unit (GPU) chip, power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or a combination thereof. In some alternative embodiments, the electronic components may also be passive components (e.g., resistors, inductors, capacitors etc.). In some embodiments, the electronic components may be a combination of any of the above-mentioned candidates.

In some embodiments, conductive connectors 146 are formed on either the UBMLs 126 or the integrated component packages 140. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 146 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

The integrated component packages 140 are then attached to the integrated circuit package 100 using the conductive connectors 146. Attaching the integrated component packages 140 may include placing the integrated component packages 140 and reflowing the conductive connectors 146 to physically and electrically couple the integrated component packages 140 and to the underlying UBMLs 126.

In some embodiments, an underfill 144 is placed surrounding the conductive connectors 146. The underfill 144 may reduce stress and protect the joints resulting from the reflowing of the conductive connectors 146. The underfill 144 may also be included to securely bond the integrated component packages 140 to the integrated circuit package 100 and provide structural support and environmental protection. The underfill 144 may be formed by a capillary flow process after the integrated component packages 140 are attached, or may be formed by a suitable deposition method before the integrated component packages 140 are attached. The underfill 144 may be formed of a molding compound, epoxy, or the like, and may be applied by injection molding, transfer molding, or the like. The underfill 144 may be applied in liquid or semi-liquid form and then subsequently cured.

Figure 4:
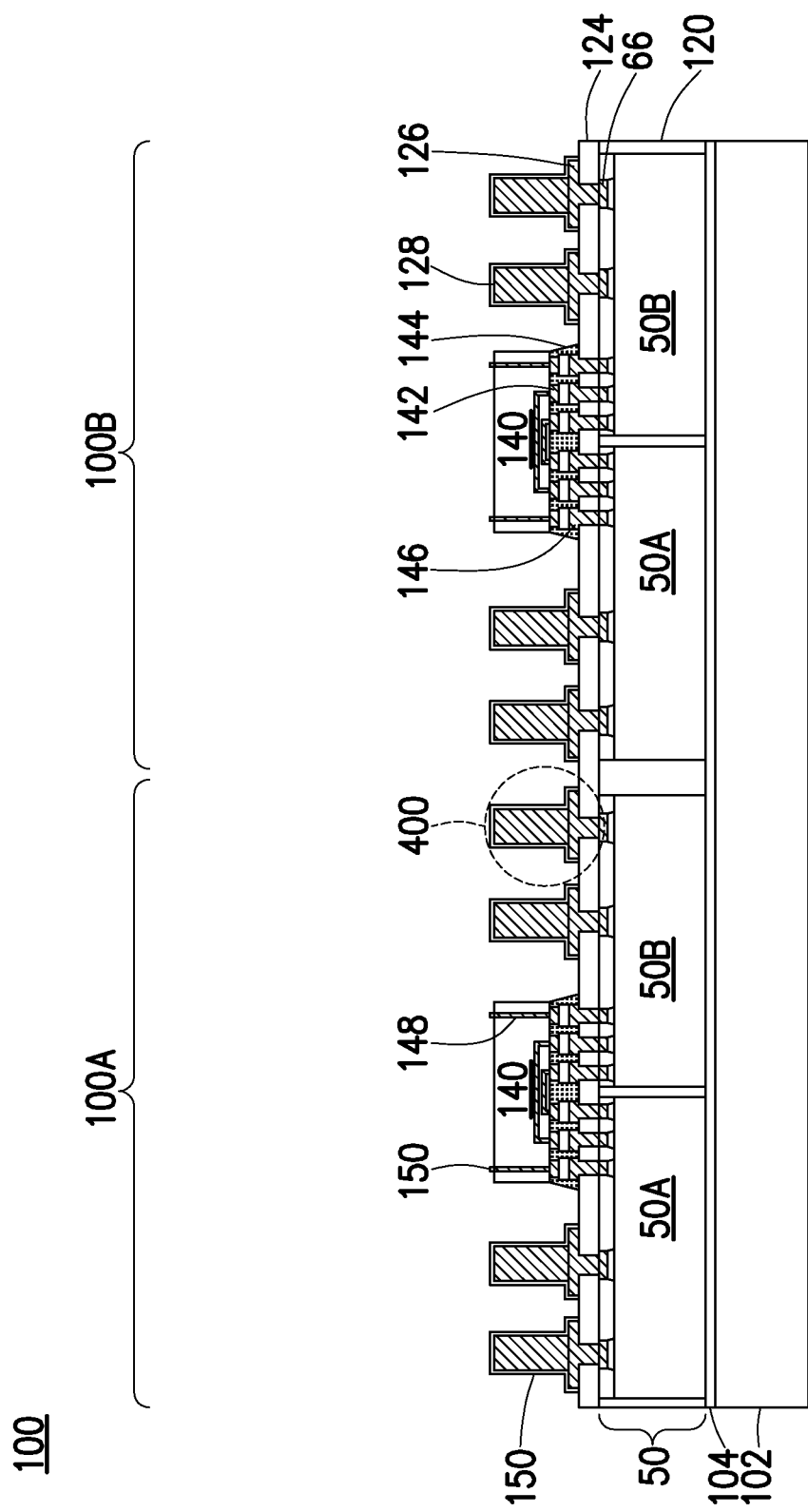

In FIG. 4, a pre-treatment is performed on the structure and, afterward, a protective layer 150 is formed over and around the UBMLs 126 and the through vias 128. In addition, the protective layer 150 may also be formed over the TSVs 148, if exposed. For example, before forming the protective layer 150, the through vias 128 and the UBMLs 126 (and the TSVs 148) may be pre-treated to remove the metal oxide surface layer (e.g., native oxide) that may have formed along the surface as discussed above. In some embodiments, the through vias 128 and the UBMLs 126 may be pre-treated with an acid spray comprising sulfuric acid ($H_2SO_4$). In other embodiments, the through vias 128 may be pre-treated with a hydrogen treatment, such as a hydrogen plasma treatment.

Figure 5:
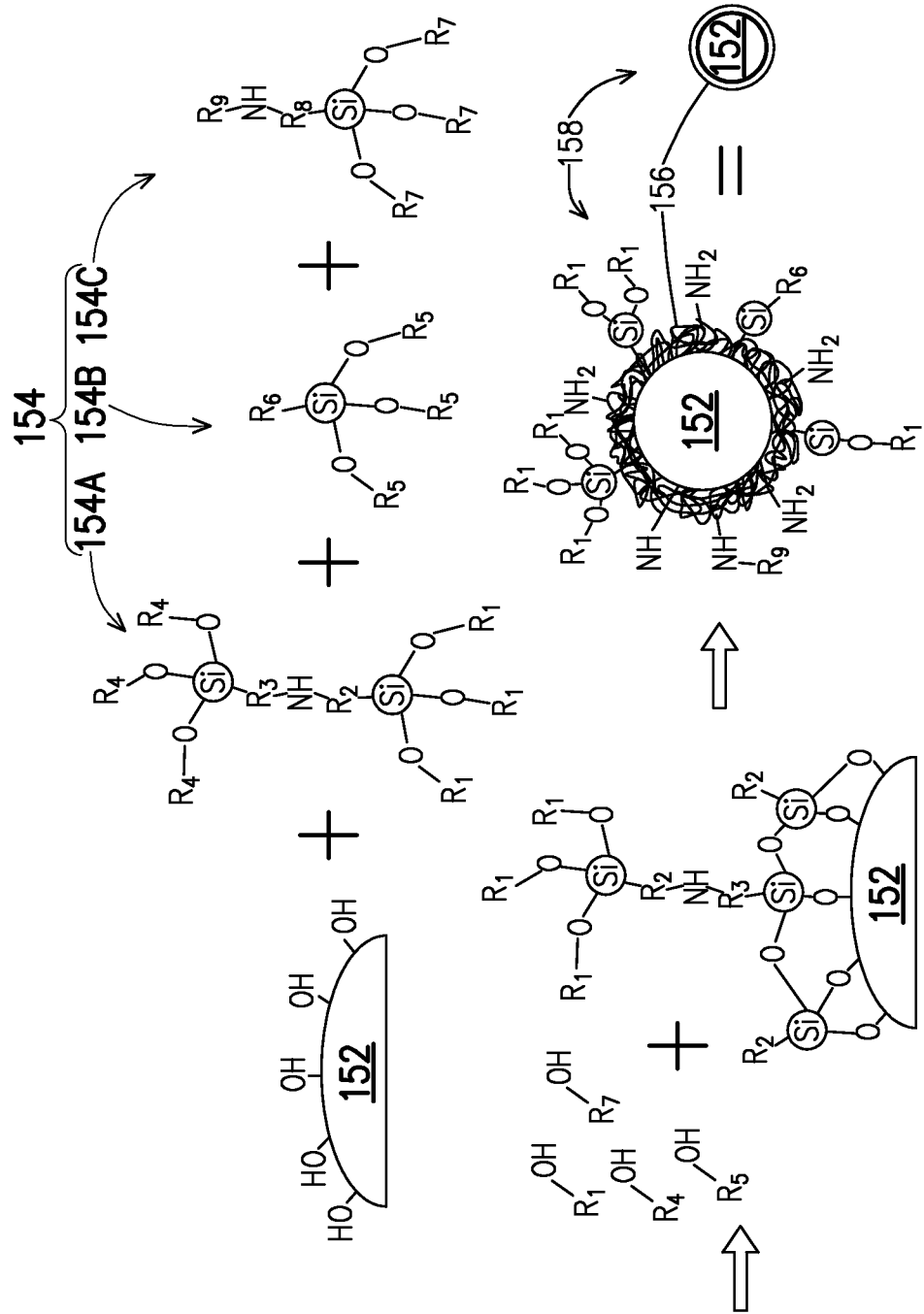
FIG. 5 illustrates a mechanism for intermediate steps during a process for forming an integrated circuit package in accordance with some embodiments.

FIG. 5 illustrates a mechanism in the formation of the protective material 158 before being applied to form the protective layer 150. Preparing the protective material 158 includes forming an organic coating 156 (e.g., an outer shell) of organic compounds 154 around inorganic pellets 152 (e.g., an inner core). As discussed in greater detail below, the inorganic pellets 152 and the organic compounds 154 may be mixed together in a solvent.

The inorganic pellets 152 may comprise a metal oxide, such as zirconium oxide, chromium oxide, titanium oxide, molybdenum oxide, cobalt oxide, manganese oxide, tungsten oxide, vanadium oxide, or any combinations thereof. As illustrated, the metal oxide of the inorganic pellets 152 further includes hydroxyl groups, particularly along the outer surface, which provide attachment or bonding sites when mixed with the organic compounds 154 as discussed below. Each inorganic pellet 152 may have a diameter of between about 10 nm and about 30 nm.

The organic compounds 154 may comprise one or more of a first organic compound 154A, a second organic compound 154B, and/or a third organic compound 154C. The organic compounds 154 may be selected as being silicon-based (Si) and/or amine-based (—NH— or —NH$_2$) molecules having alkoxy end functional groups capable of undergoing replacement reactions with the hydroxyl groups along the outer surfaces of the inorganic pellets 152. For example, the alkoxy groups of the organic compounds 154 may include ethoxy groups such that the product of the replacement reaction yields the same alcohol as may be used in the solvent (e.g., ethanol, as discussed below).

The first organic compound 154A may have a chemical structure such as $(OR_1)_3$—Si—$R_2$—NH—$R_3$—Si—$(OR_4)_3$, wherein $R_1=R_4=C_nH_{2n+1}$ such that each n is an integer greater than or equal to 0 (either the same or different values for n), and wherein $R_2=R_3=C_nH_{2n}$ or $OC_nH_{2n}$ such that each n is an integer greater than or equal to 0 (either the same or different values for n). In accordance with some embodiments, the first organic compound 154A may be bis[3-(triethoxysilyl)propyl]amine (($OCH_2CH_3)_3Si(CH_2)_3NH(CH_2)_3Si(OCH_2CH_3)_3$). However, any suitable organic compound may be used.

The second organic compound 154B may have a chemical structure such as $(OR_5)_3$—Si—$R_6$, wherein $R_5=C_nH_{2n+1}$ such that each n is an integer greater than or equal to 0 (either the same or different values for n), and wherein $R_6$=H, $C_nH_{2n+1}$, $C_nH_{2n}OH$, $C_nH_{2n}NH$—$C_nH_{2n}OH$, $C_nH_{2n}NH_2$, $C_nH_{2n}NH$—$C_nH_{2n}NH_2$, $C_nH_{2n}COOH$, $C_nH_{2n}COOC_nH_{2n+1}$, $C_nH_{2n}COOC_nH_{2n}NH_2$, $C_nH_{2n}COOC_nH_{2n}NH$—$C_nH_{2n}NH_2$, $C_nH_{2n}COOC_nH_{2n}SH$, $C_nH_{2n}COOC_nH_{2n}NH$—$C_nH_{2n}SH$, $C_nH_{2n}SH$, $C_nH_{2n}NH$—$C_nH_{2n}SH$, $C_nH_{2n}COOCH_2$=CH, or $C_nH_{2n}NHCOOCH_2$=CH, such that n is an integer greater than or equal to 0. Additionally, the second organic compound 154B may have a chemical structure for $R_6$ as illustrated in either example below, such that n is an integer greater than or equal to 0.

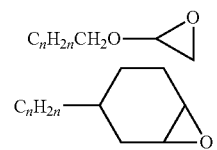

In accordance with some embodiments, the second organic compound 154B may be n-(β-aminoethyl)-γ-aminopropyltriethoxysilane (($OCH_2CH_3)_3Si(CH_2)_3NH(CH_2)_2NH_2$). However, any suitable organic compound may be used.

The third organic compound 154C may have a chemical structure such as $(OR_7)_3$—Si—$R_8$—NH—$R_9$, wherein $R_7=C_nH_{2n+1}$ such that n is an integer greater than or equal to 0, wherein $R_8=C_nH_{2n}$ such that n is an integer greater than or equal to 0, and wherein $R_9$=H, $C_nH_{2n+1}$, $C_nH_{2n}OH$, $C_nH_{2n}NH$—$C_nH_{2n}OH$, $C_nH_{2n}NH_2$, $C_nH_{2n}NH$—$C_nH_{2n}NH_2$, $C_nH_{2n}COOH$, $C_nH_{2n}COOC_nH_{2n+1}$, $C_nH_{2n}COOC_nH_{2n}NH_2$, $C_nH_{2n}COOC_nH_{2n}NH$—$C_nH_{2n}NH_2$, $C_nH_{2n}COOC_nH_{2n}SH$, $C_nH_{2n}COOC_nH_{2n}NH—C_nH_{2n}SH$, $C_nH_{2n}SH$, or $C_nH_{2n}NH—C_nH_{2n}SH$ such that n is an integer greater than or equal to 0. In accordance with some embodiments, the third organic compound 154C may not be used in the formation of the protective material 158. However, any suitable organic compound may be used.

The protective material 158 may be formed by mixing and reacting the inorganic pellets 152 with the organic compounds 154. For example, the protective material 158 may be formed by introducing a powder comprising the inorganic pellets 152 into an organic solution comprising the organic compounds 154 and the solvent. The solvent may comprise water, alcohol (e.g., ethanol), and/or any acceptable liquid. The mixing may be performed at temperatures of between about 30° C. and about 70° C. and for a duration of between about 30 minutes and about 5 hours. In other embodiments, the inorganic pellets 152 may be added to the solvent before adding the organic compounds 154, or the ingredients may be added simultaneously.

As a result of the mixing, the organic coating 156 (e.g., the outer shell) comprising bulk portions of the organic compounds 154 forms around the inorganic pellets 152 (e.g., an inner core). For example, the replacement reaction discussed above results in the organic compounds 154 attaching to the outer surfaces of the inorganic pellets 152 to form the organic coating 156. After bonding to the inorganic pellets 152, portions of the organic compounds 154, such as the amine groups and silicon atoms (and proximal portions), may fold over the rest of the organic compounds 154 and over the outer surfaces of the inorganic pellets 152, thereby giving the organic coating 156 a higher density and a greater coverage. In addition, adjacent ones of the organic compounds 154 bonded to the inorganic pellets 152 may bond with one another to provide further chemical stability and greater coverage of the organic coating 156.

In accordance with some embodiments, as stated above, the organic compounds 154 may comprise a mixture of the first organic compound 154A (e.g., bis[3-(triethoxysilyl)propyl]amine)) and the second organic compound 154B (e.g., n-(β-aminoethyl)-γ-aminopropytriethoxysilane), respectively, as illustrated below. Both molecules have alkoxy groups (e.g., ethoxy groups as $R_1$, $R_4$, and $R_5$) to react with the hydroxyl groups of the inorganic pellets 152 during formation of the protective material 158.

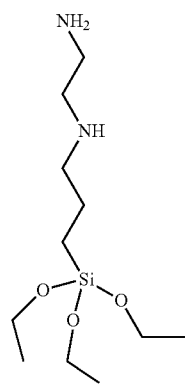

-continued

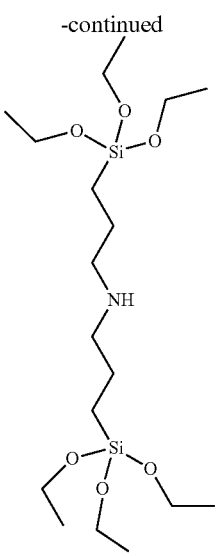

After forming the protective material 158, the protective layer 150 is formed over the through vias 128, the UBMLs 126, and the exposed TSVs 148 by applying the protective material 158 over the structure. The protective material 158 may be applied, for example, by spraying, dipping, puddling, paddling, immersing, spinning on, the like, or any suitable process. The protective material 158 selectively bonds (e.g., chemically bonds) or reacts with the through vias 128 and the UBMLs 126 as compared to other features, such as non-conductive or non-metallic features. Formation of the protective layer 150 may be performed at room temperature (e.g., about 25° C.) because the protective material 158 will readily react with the material of the UBMLs 126 and the through vias 128. The pre-treatment described above ensures that the protective material 158 can react directly with the conductive portions of the UBMLs 126 and the through vias 128 without being inhibited by the metal oxide surface layer.

It should be noted that some of the alkoxy groups (e.g., ethoxy groups) of the organic compound 154 may remain unreacted during formation of the protective material 158 and, therefore, extend outward from the organic coating 156 to serve as reactive sites for the protective material 158 to bond with the conductive features during formation of the protective layer 150. For example, in embodiments in which the organic compounds 154 comprise bis[3-(triethoxysilyl)propyl]amine $((OCH_2CH_3)_3Si(CH_2)_3NH(CH_2)_3Si(OCH_2CH_3)_3)$ as the first organic compound 154A, the organic coating 156 will have ethoxy groups (e.g., $R_1$ and/or $R_4$) extending outward from each particle of the protective material 158. These ethoxy groups improve the adhesiveness of the protective layer 150 to the conductive features (e.g., the UBMLs 126 and the through vias 128) by bonding with the material of the conductive features. Additionally, these ethoxy groups provide internal cohesiveness within the protective layer 150 by facilitating bonding between adjacent particles of the protective material 158.

Figure 6:
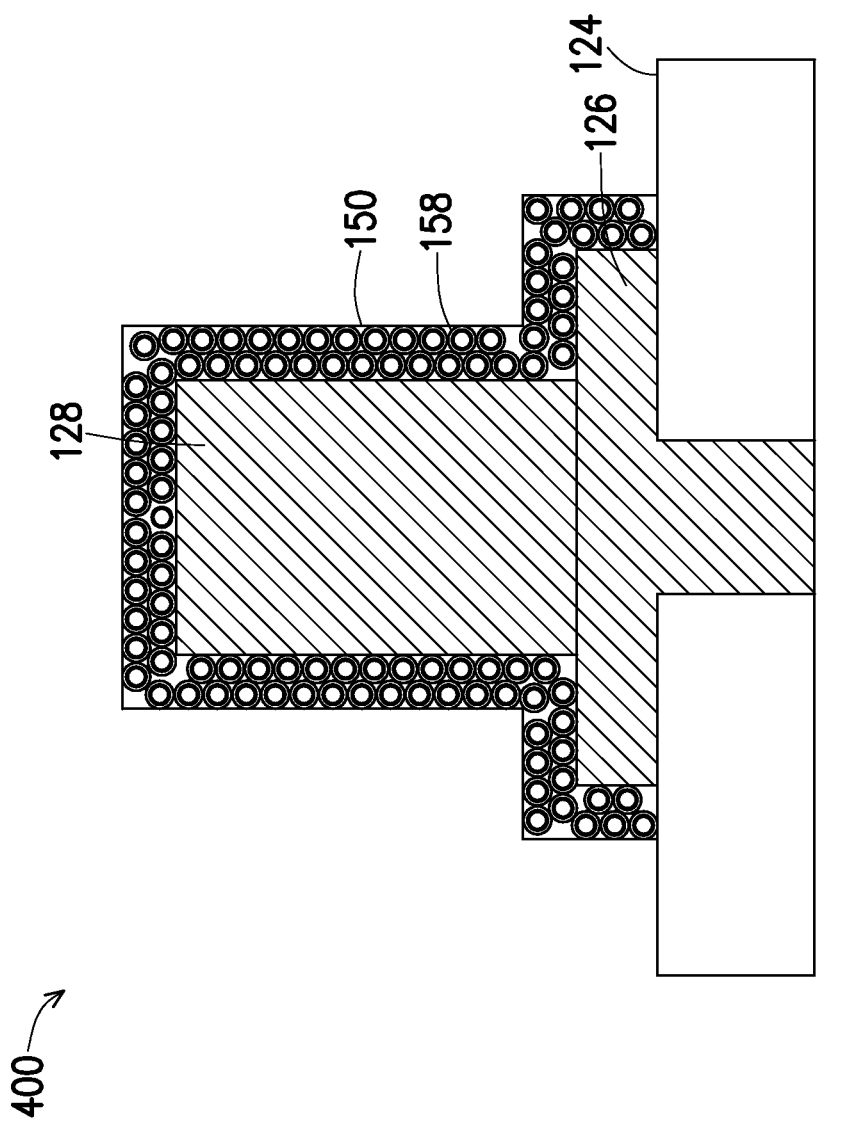

FIG. 6 illustrates a zoomed-in view of region 400 of FIG. 4 after treating the UBMLs 126 and the through vias 128 with the protective material 158 to form the protective layer 150. The protective layer 150 may comprise one or more layers of the protective material 158. As illustrated, in some embodiments, the protective layer 150 may comprise about two or more layers of the protective material 158. In other embodiments, the protective layer 150 may comprise about one monolayer of the protective material 158. An additional advantage of the composition of the protective material 158 (e.g., the inorganic pellets 152 composing the metal oxide core) is that the protective layer provides passivation protection to the underlying conductive features (e.g., the UBMLs 126 and the through vias 128) against, for example, ambient oxygen and moisture as well as oxygen and moisture used in subsequent processing steps. As such, the passivation protection will tend to increase with increasing thicknesses of the protective layer 150. The protective layer 150 may be formed to a thickness of between about 5 nm and about 1000 nm. However, any suitable thickness or number of monolayers may be formed.

As discussed above, the organic coating 156 on a particle of the protective material 158 having alkoxy functional groups will react and form bonds with alkoxy functional groups from other particles of the protective material 158. As a result, the organic coating 156 around adjacent inorganic pellets 152 may become interconnected throughout portions or the entirety of the protective layer 150. The organic coating 156 of those portions of the protective layer 150 may be described as an interconnected organic web around those particular inorganic pellets 152.

Following formation of the protective layer 150, the structure is rinsed with water to remove the protective material 158 that is not bonded or otherwise attached to the conductive features (e.g., the UBMLs 126 and the through vias 128). In particular, the water rinse removes the protective material 158 that may have deposited over features of the structure other than the UBMLs 126 and the through vias 128. During the water rinse, the protective layer 150 protects the underlying conductive features (e.g., the UBMLs 126 and the through vias 128) from oxidation. For example, the protective layer 150 may serve as a physical and/or chemical barrier by blocking penetration of the water molecules in the water rinse to reach and oxidize the underlying conductive features.

Figure 7:
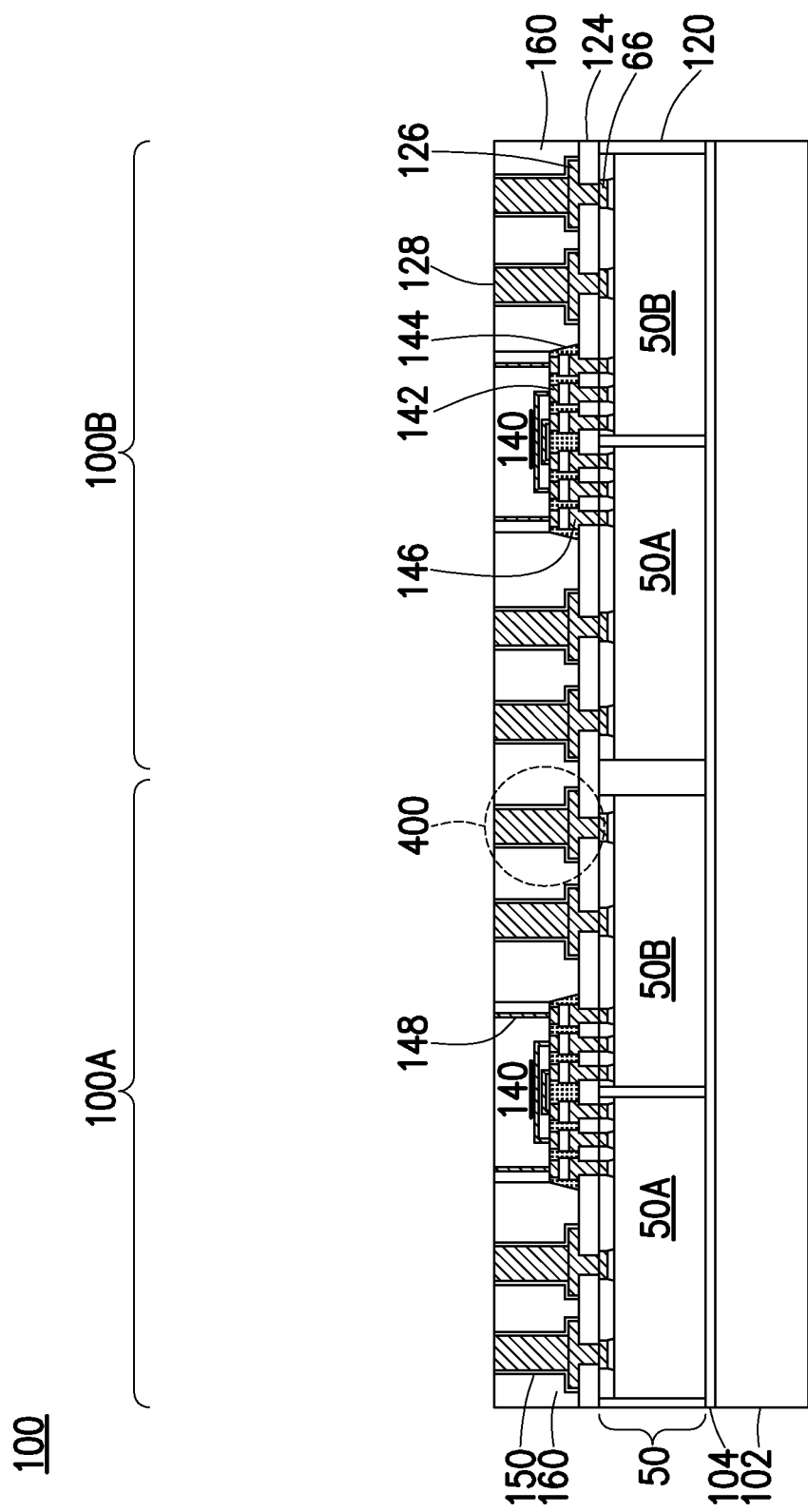

In FIG. 7, an encapsulant 160 is formed on and around the various components. After formation, the encapsulant 160 surrounds the integrated component packages 140, the through vias 128, the UBMLs 126, the underfill 144, the protective layer 150, and the top of the dielectric layer 124. The encapsulant 160 may be formed of a molding compound, epoxy, or the like, and may be applied by compression molding, transfer molding, or the like. The encapsulant 160 may be applied in liquid or semi-liquid form and then subsequently cured. The encapsulant 160 may be formed over the carrier substrate 102 such that the through vias 128 and integrated component packages 140 are buried or covered. As discussed above, due to exposed functional groups of the protective layer 150 (e.g., the alkoxy groups, such as ethoxy groups, extending from an outer surface of the protective layer 150), the encapsulant 160 has a strong adhesion to the protective layer 150. In some embodiments, the exposed alkoxy groups of the protective layer 150 may bond or otherwise attract with the encapsulant 160 to provide the strong adhesion between the layers.

A planarization process may be performed on the encapsulant 160 to expose the protective layer 150, the through vias 128, and the TSVs 148 of the integrated component packages 140. In embodiments in which a dielectric material of the integrated component packages 140 may be covering the TSVs 148, the planarization process may also serve to remove some of the dielectric material to expose the TSVs 148. Following the planarization process, topmost surfaces of the encapsulant 160, the protective layer 150, the through vias 128, and the TSVs 148 are substantially level (e.g., planar) within process variations. The planarization process may be, for example, a CMP process, a grinding process, or the like. Other processes may be used to achieve a similar result. As discussed above, an advantage of the strong adhesion between the protective layer 150 and the conductive features (e.g., the UBMLs 126 and the through vias 128) along one side, the strong adhesion between the protective layer 150 and the encapsulant 160 on the other side, and the strong cohesion within the protective layer 150 is that delamination among those features and layers is reduced or prevented during the planarization process.

Figure 8:
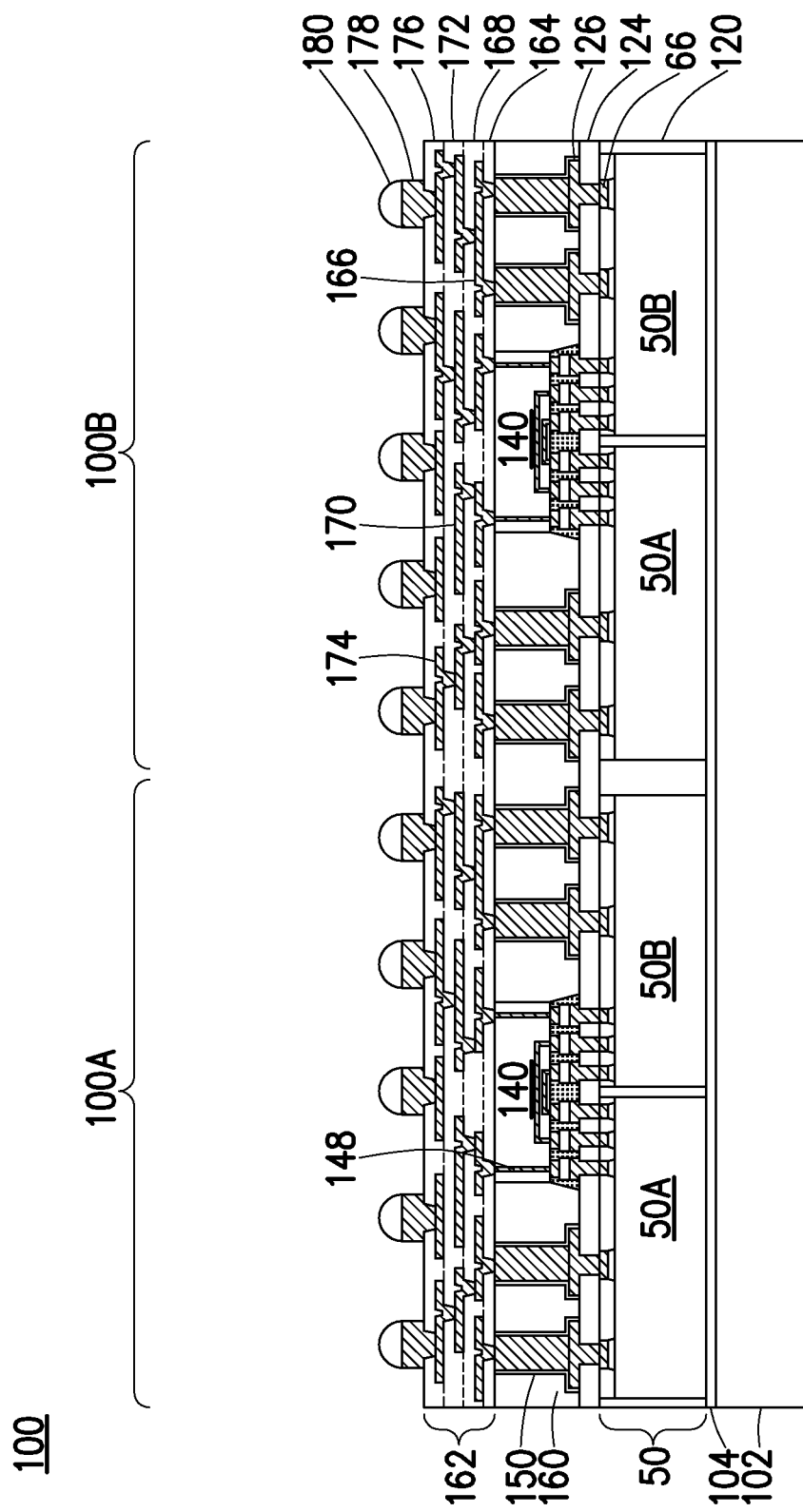

In FIG. 8, a front-side redistribution structure 162 is formed over the encapsulant 160, the protective layer 150, the through vias 128, and the integrated component packages 140. The front-side redistribution structure 162 includes dielectric layers 164, 168, 172, and 176; and metallization patterns 166, 170, and 174. The metallization patterns may also be referred to as redistribution layers or redistribution lines. The front-side redistribution structure 162 is shown as an example having three layers of metallization patterns. More or fewer dielectric layers and metallization patterns may be formed in the front-side redistribution structure 162. If fewer dielectric layers and metallization patterns are to be formed, steps and process discussed below may be omitted. If more dielectric layers and metallization patterns are to be formed, steps and processes discussed below may be repeated.

In some embodiments, the dielectric layer 164 is deposited on the encapsulant 160, the protective layer 150, the through vias 128, and the integrated component packages 140. In some embodiments, the dielectric layer 164 is formed of a photo-sensitive material such as PBO, polyimide, BCB, or the like, which may be patterned using a lithography mask. The dielectric layer 164 may be formed by spin coating, lamination, CVD, the like, or a combination thereof. The dielectric layer 164 is then patterned. The patterning forms openings exposing portions of the through vias 128 and the TSVs 148. The patterning may be by an acceptable process, such as by exposing and developing the dielectric layer 164 to light when the dielectric layer 164 is a photo-sensitive material or by etching using, for example, an anisotropic etch.

The metallization pattern 166 is then formed. The metallization pattern 166 includes conductive elements extending along the major surface of the dielectric layer 164 and extending through the dielectric layer 164 to physically and electrically couple to the through vias 128 and the integrated component packages 140. As an example to form the metallization pattern 166, a seed layer (not shown) is formed over the dielectric layer 164 and in the openings extending through the dielectric layer 164. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 166. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 166. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

In some embodiments, a dielectric layer 168 is deposited on the metallization pattern 166 and the dielectric layer 164. The dielectric layer 168 may be formed in a manner similar to the dielectric layer 164, and may be formed of a similar material as the dielectric layer 164.

The metallization pattern 170 is then formed. The metallization pattern 170 includes portions on and extending along the major surface of the dielectric layer 168. The metallization pattern 170 further includes portions extending through the dielectric layer 168 to physically and electrically couple the metallization pattern 166. The metallization pattern 170 may be formed in a similar manner and of a similar material as the metallization pattern 166. In some embodiments, the metallization pattern 170 has a different size than the metallization pattern 166. For example, the conductive lines and/or vias of the metallization pattern 170 may be wider or thicker than the conductive lines and/or vias of the metallization pattern 166. Further, the metallization pattern 170 may be formed to a greater pitch than the metallization pattern 166.

In some embodiments, such as that shown in FIG. 8, additional dielectric layers 172 and 176, as well as metallization pattern 174 are formed by repeating the processes described above. The dielectric layers 172 and 176 may be formed in a manner similar to the dielectric layer 164, and may be formed of a similar material as the dielectric layer 164. The metallization pattern 174 may be formed in a manner similar to metallization patterns 166 and 170, and may be formed of a similar material as metallization patterns 166 and 170.

In the embodiment shown, the metallization pattern 174 is the topmost metallization pattern of the front-side redistribution structure 162. As such, all of the intermediate metallization patterns of the front-side redistribution structure 162 (e.g., the metallization patterns 166 and 170) are disposed between the metallization pattern 174 and the integrated component packages 140. In some embodiments, the metallization pattern 174 has a different size than the metallization patterns 166 and 170. For example, the conductive lines and/or vias of the metallization pattern 174 may be wider or thicker than the conductive lines and/or vias of the metallization patterns 166 and 170. Further, the metallization pattern 174 may be formed to a greater pitch than the metallization pattern 170. As discussed above, additional dielectric layers and metallization patterns may be included in the front-side redistribution structure 162 by repeating steps described above. If fewer dielectric layers and metallization patterns are desired in the front-side redistribution structure 162, then steps described above may be omitted.

In some embodiments, such as the embodiment shown in FIG. 8, under-bump metallurgy layers (UBMLs) 178 are formed for external connection to the front-side redistribution structure 162. The UBMLs 178 have bump portions on and extending along the major surface of the dielectric layer 176, and have via portions extending through the dielectric layer 176 to physically and electrically couple the metallization pattern 174. As a result, the UBMLs 178 are electrically coupled to the through vias 128 and the integrated component packages 140. The UBMLs 178 may be formed of the same material as the metallization pattern 166. In some embodiments, the UBMLs 178 have a different size than the metallization patterns 166, 170, and 174.

In some embodiments, conductive connectors 180 are formed on the UBMLs 178. The conductive connectors 180 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 180 may include a conductive material such as solder, copper, aluminum, gold, nickel, silver, palladium, tin, the like, or a combination thereof. In some embodiments, the conductive connectors 180 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 180 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 9:
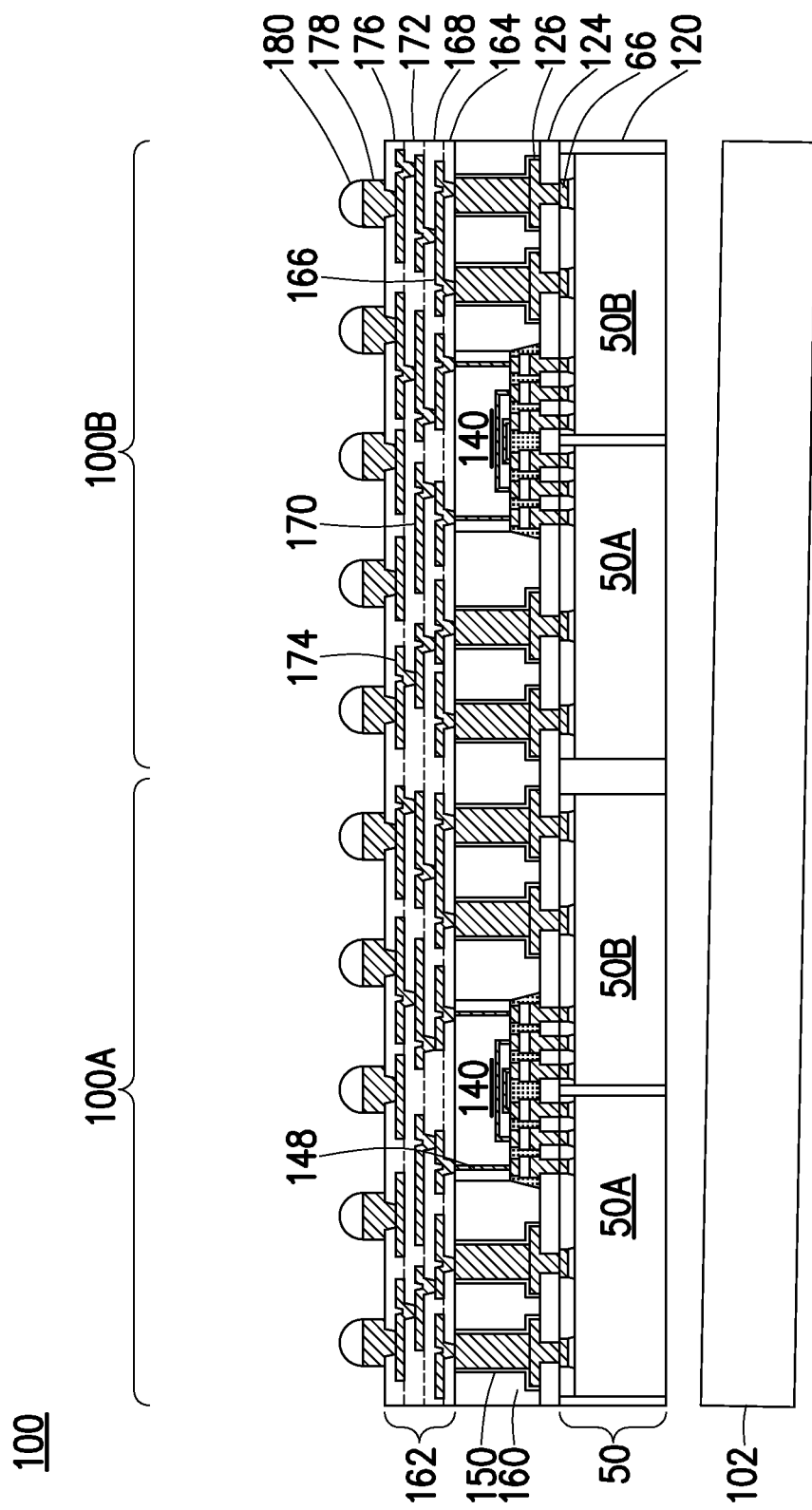

In FIG. 9, a de-bonding of the carrier substrate 102 is performed to detach (or "de-bond") the carrier substrate 102 from the integrated circuit dies 50 and the encapsulant 120. In accordance with some embodiments, the de-bonding includes projecting a light such as a laser light or an UV light on the release layer 104 so that the release layer 104 decomposes under the heat of the light and the carrier substrate 102 can be removed. Although not specifically illustrated, the structure may be flipped over and placed on a tape.

Figure 10:
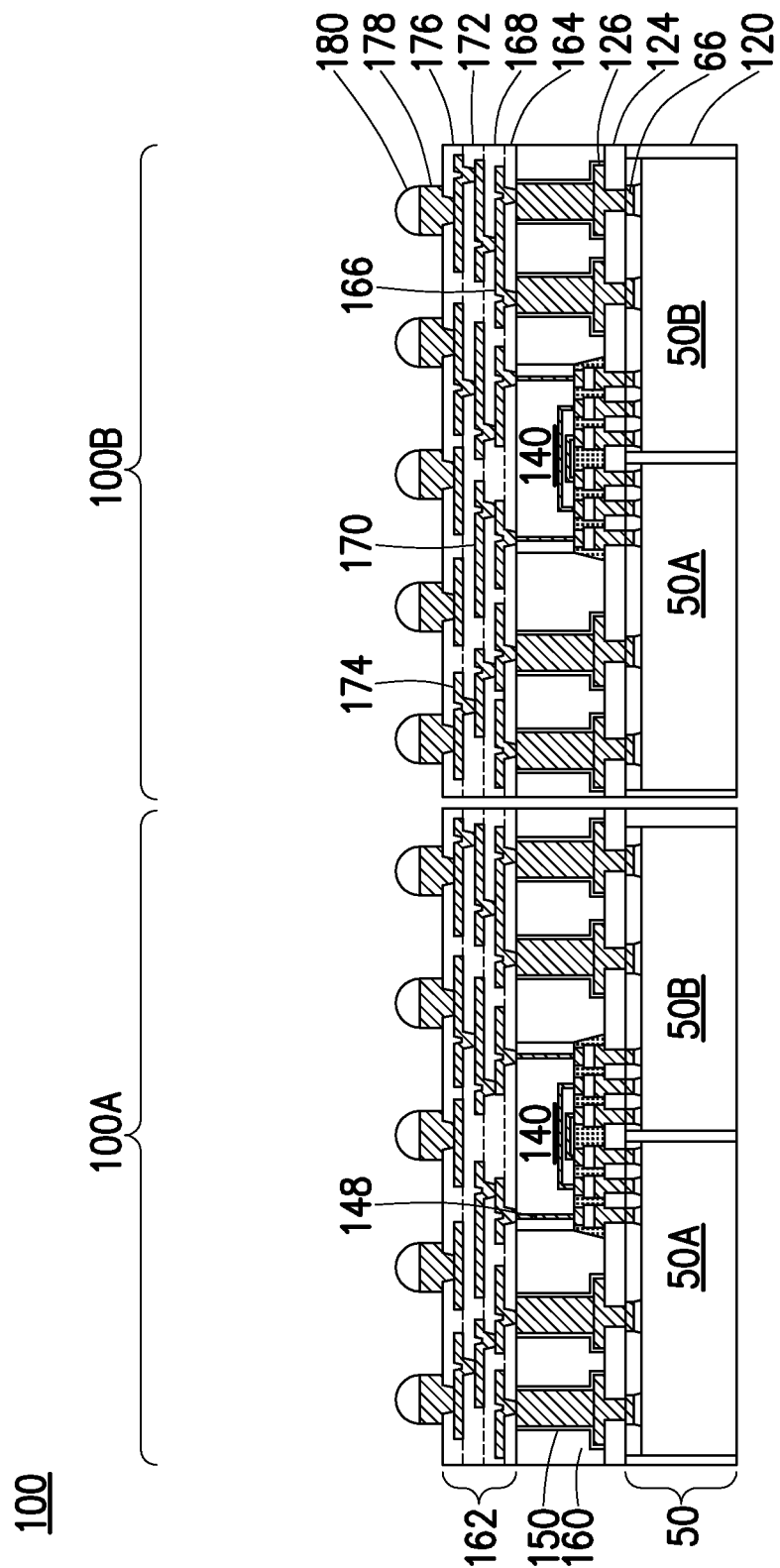

In FIG. 10, a singulation process is performed by sawing along scribe line regions, for example, between the first package region 100A and the second package region 100B. The sawing singulates the first package region 100A from the second package region 100B. The resulting singulated devices are from one of the first package region 100A and the second package region 100B.

Figure 11:
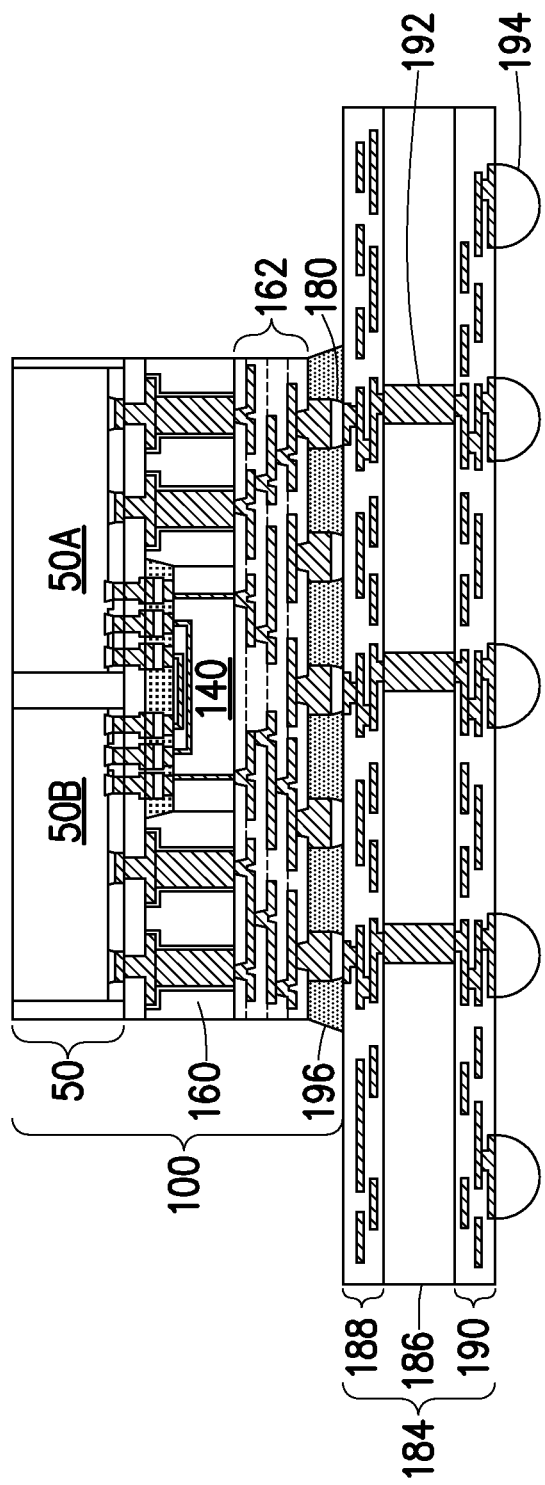

In FIG. 11, the singulated devices may then be implemented in other device stacks, for example, PoP structures or a Flip Chip Ball Grid Array (FCBGA) package, to form a completed or partially completed 3D package 200 (e.g., a 3D integrated circuit (3DIC) device). In such embodiments, the singulated device is flipped and mounted to an interconnect package substrate 184 using the conductive connectors 180. As illustrated, the interconnect package substrate 184 may include a substrate 186 interposed between a first redistribution structure 188 and a second redistribution structure 190. The first and second redistribution structures 188/190 may be electrically coupled to one another with through substrate vias (TSVs) 192 extending from one side of the substrate 186 to the other. The first redistribution structure 188 may include conductive pads to facilitate electrical and physical coupling to the conductive connectors 180. External connectors 194 may be attached to the second redistribution structure 190 to facilitate subsequent electrically coupling to other package components.

Attaching the singulated devices 100 may include placing the singulated devices 100 over the interconnect package substrate 184 and reflowing the conductive connectors 180 to physically and electrically couple the singulated devices 100 to the underlying conductive pads of the first redistribution structure 188. In some embodiments, an underfill 196 is placed surrounding the conductive connectors 180. The underfill 196 may reduce stress and protect the joints resulting from the reflowing of the conductive connectors 180. The underfill 196 may also be included to securely bond the singulated devices 100 to the interconnect package substrate 184 and provide structural support and environmental protection. The underfill 196 may be formed by a capillary flow process after the singulated devices 100 are attached, or may be formed by a suitable deposition method before the singulated devices 100 are attached. The underfill 196 may be formed of a molding compound, epoxy, or the like, and may be applied by injection molding, transfer molding, or the like. The underfill 196 may be applied in liquid or semi-liquid form and then subsequently cured.

In addition, other features and processes may also be included with the 3D package 200. For example, testing structures may be included to aid in the verification testing of the 3D package 200. The testing structures may include, for example, test pads formed in any of the redistribution layers (e.g., the front-side redistribution structure 162, the first redistribution structure 188, and/or the second redistribution structure 190) or on a substrate within either partial package that allows the testing of the 3D package 200, the use of probes and/or probe cards, and the like. The verification testing may be performed on intermediate structures (e.g., the singulated devices 100, the interconnect package substrate 184, and/or the 3D package 200) as well as the final structure. Additionally, the structures and methods disclosed herein may be used in conjunction with testing methodologies that incorporate intermediate verification of known good dies to increase the yield and decrease costs.

Figure 12:
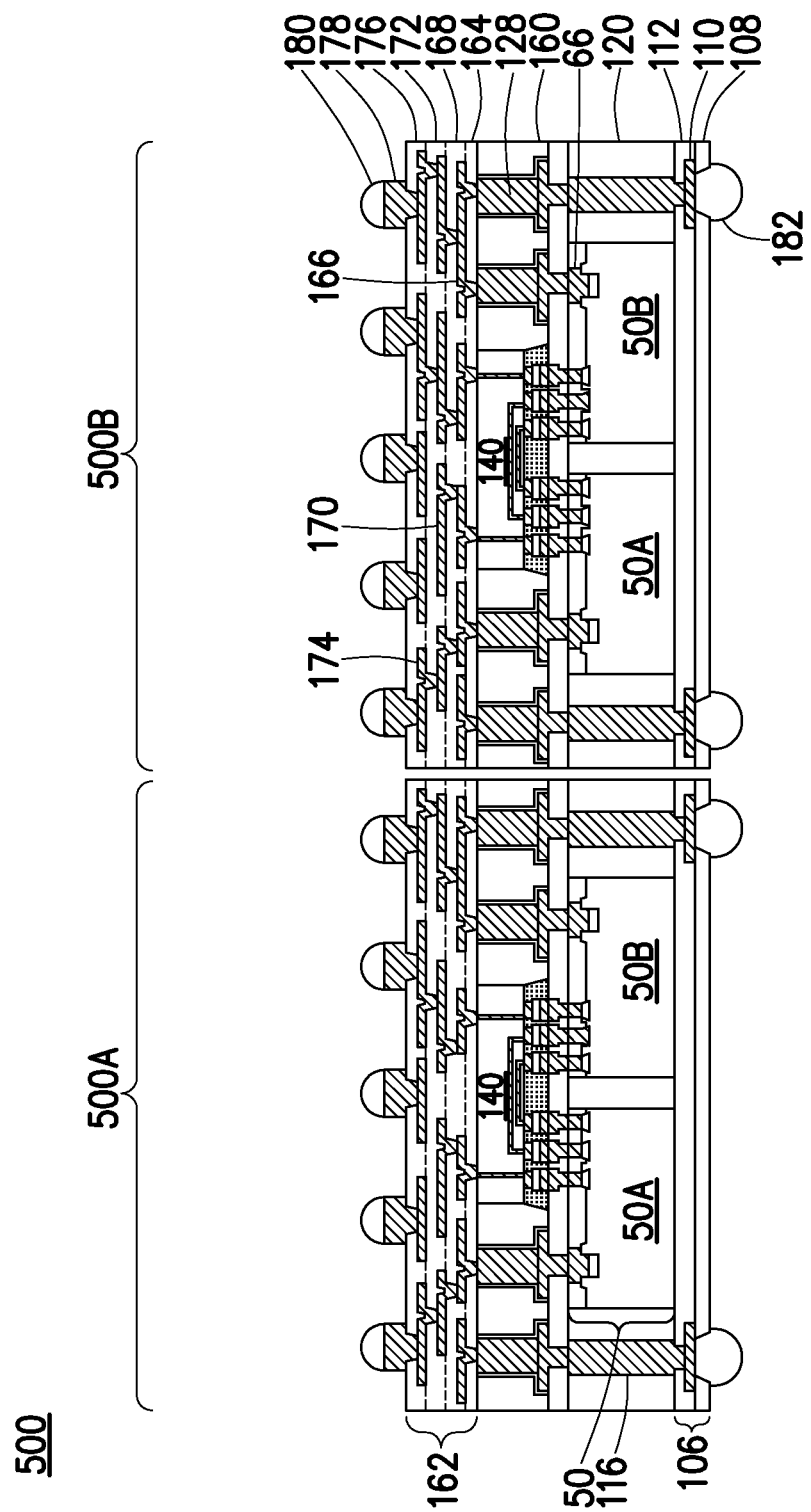

FIG. 12 illustrates a cross-sectional view of another embodiment in which through vias 116 are formed in an integrated circuit package 500. In this embodiment, a first package region 500A and a second package region 500B are illustrated, and one or more integrated circuit dies 50 are packaged to form the integrated circuit package 500 in each of the package regions 500A and 500B. The integrated circuit package 500 may be formed using similar or different processes and materials as described above in connection with the integrated circuit package 100. The integrated circuit package 500 may include additional features than the integrated circuit package 100 discussed above. For example, the integrated circuit package 500 may include a back-side redistribution structure 106 adjacent to the integrated circuit dies 50 and/or through vias 116 electrically coupling the back-side redistribution structure 106. In addition, conductive connectors 182 may be formed over the back-side redistribution structure 106 to enable further electrical coupling to other semiconductor packages (not specifically illustrated).

In some embodiments, the back-side redistribution structure 106 may be formed on the release layer 104 (see FIG. 1) prior to placement of the integrated circuit dies 50. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional. In some embodiments, optionally, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by an acceptable deposition process, such as spin coating, CVD, laminating, the like, or a combination thereof.

The metallization pattern 110 may be formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof.

The back-side redistribution structure 106 is illustrated as having a single metallization pattern 110 for illustrative purposes, and is not intended to be limiting. In some embodiments, the back-side redistribution structure 106 may include any number of dielectric layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines.

Once the back-side redistribution structure 106 has been formed, the through vias 116 are formed over and through the dielectric layer 112. For example, the dielectric layer 112 may be patterned to form openings exposing portions of the metallization pattern 110. The patterning may be performed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure. The through vias 116 are then formed in the openings and extend away from the topmost dielectric layer of the back-side redistribution structure 106 (e.g., the dielectric layer 112).

As an example to form the through vias 116, a seed layer (not shown) is formed over the back-side redistribution structure 106, e.g., on the dielectric layer 112 and portions of the metallization pattern 110 exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating, or the like, and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Once the through vias 116 have been formed, the manufacturing may be continued as described above, with respect to FIGS. 1-11. For example, the encapsulant 120 may be placed around the integrated circuit dies 50 and the through vias 116, the through vias 128 are formed, the integrated component packages 140 are connected, the protective layer 150 is formed, the encapsulant 160 is placed, and the front-side redistribution structure 162 is formed. However, any suitable steps or combination of steps may be utilized.

Note that the space available for the through vias 116 in the first package region 500A and the second package region 500B may be limited, particularly when the integrated circuit dies 50 include devices with a large footprint, such as SoCs. Use of the back-side redistribution structure 106 allows for an improved interconnect arrangement when the first package region 500A and the second package region 500B have limited space available for the through vias 116.

Still referring to FIG. 12, the conductive connectors 182 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 182 are formed in the openings. In some embodiments, the conductive connectors 182 comprise flux and are formed in a flux dipping process. In some embodiments, the conductive connectors 182 comprise a conductive paste such as solder paste, silver paste, or the like, and are dispensed in a printing process. In some embodiments, the conductive connectors 182 are formed in a manner similar to the conductive connectors 180, and may be formed of a similar material as the conductive connectors 180.

The integrated circuit packages 500A and 500B may be singulated before or after formation of the conductive connectors 182. Although not specifically illustrated, the singulated integrated circuit packages 500A and 500B may be implemented in other device stacks, for example, PoP structures or a FCBGA package, to form a completed or partially completed 3D package (e.g., a 3DIC device), similarly as discussed above in connection with FIG. 11.

Embodiments may achieve advantages. For example, lower cost, higher efficiency, and increase yield of manufacturing and improved performance and reliability of use of integrated circuit packages (e.g., the singulated device 100 and the 3D package 200) can be realized due to faster processing times, greater passivation protection, and delamination prevention from formation of the disclosed protective layer 150 over conductive features (e.g., the UBMLs 126 and the through vias 128) and before the encapsulant 160 is applied. In particular, the protective layer 150 may be formed of particles that chemically bond with the underlying conductive features as well as with the overlying encapsulant 160. The bonds provide stronger adhesion, which prevents or reduces delamination of the encapsulant 160 from the conductive features during subsequent processing (e.g., planarization processes) or use of the completed device. In addition, the protective layer 150 provides passivation protection to the conductive features against, for example, oxygen and moisture. Increasing the thickness and/or number of layers of particles in the protective layer 150 may increase the passivation protection. Further, the application and bonding of the protective layer 150 to the conductive features occurs quickly, thereby preventing or minimizing oxidation of the conductive features by ambient oxygen. This immediate and robust passivation protection reduces the need, otherwise, to immediately place the encapsulant 160 around the conductive features.

In an embodiment, a method includes forming a conductive feature adjacent to a substrate; treating the conductive feature with a protective material, the protective material comprising an inorganic core with an organic coating around the inorganic core, the treating the conductive feature comprising forming a protective layer over the conductive feature; and forming an encapsulant around the conductive feature and the protective layer. In another embodiment, the method further includes, before forming the encapsulant, rinsing the protective layer with water. In another embodiment, the protective layer is selectively formed over the conductive feature. In another embodiment, the method further includes forming the protective material, the forming the protective material comprising adding a plurality of inorganic pellets to an organic solution to form the organic coating around each one of the plurality of inorganic pellets. In another embodiment, the protective layer has a thickness of greater than one monolayer of the protective material. In another embodiment, the treating the conductive feature with the protective material comprises the protective material reacting with a material of the conductive feature. In another embodiment, the inorganic core comprises a metal oxide. In another embodiment, the method further includes, before treating the conductive feature with the protective material, removing a metal oxide layer from the conductive feature.

In an embodiment, a method includes forming a protective material, the forming the protective material comprising: mixing an organic compound into a solvent to form an organic solution; and mixing a plurality of inorganic pellets into the solvent, wherein after mixing the plurality of inorganic pellets and mixing the organic compound, the organic compound forms a coating over each pellet of the plurality of inorganic pellets; applying the protective material to a conductive feature to form a protective layer; and placing a polymer material around the conductive feature and the protective layer. In another embodiment, the plurality of inorganic pellets comprises metal oxide. In another embodiment, the organic compound comprises a silicon atom and an amine group. In another embodiment, the applying the protective material to the conductive feature comprises selectively forming the protective layer adjacent to the conductive feature. In another embodiment, the applying the protective material to the conductive feature is performed at about 25° C. In another embodiment, the protective layer is chemically bonded to the conductive feature. In another embodiment, the mixing the organic compound into the solvent is performed at a temperature of between about 30° C. and about 70° C.

In an embodiment, a semiconductor device includes a conductive feature disposed over a dielectric layer; an integrated circuit die disposed over the dielectric layer and laterally displaced from the conductive feature; an encapsulant around the conductive feature and the integrated circuit die; and a protective layer disposed between the conductive feature and the encapsulant, the protective layer comprising a plurality of inorganic pellets embedded in an organic web. In another embodiment, the inorganic pellets comprise metal oxide. In another embodiment, the organic web comprises silicon and amine groups. In another embodiment, the protective layer comprises more than one layer of the inorganic pellets. In another embodiment, the organic web is chemically bonded to the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, those skilled in the art should be able to apply the embodiments disclosed herein to forming an analogous protective layer (e.g., comprising an analogous protective material) over other conductive features (e.g., copper features) that will be subsequently encapsulated within an encapsulant. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a conductive feature adjacent to a substrate;
    treating the conductive feature with a protective material, the protective material comprising an inorganic core with an organic coating around the inorganic core, the treating the conductive feature comprising forming a protective layer over the conductive feature;
    after treating the conductive feature, performing a rinse to remove some of the protective material; and
    forming an encapsulant around the conductive feature and the protective layer.

2. The method of claim 1, further comprising forming the protective material, the forming the protective material comprising:
    mixing an organic compound into a solvent to form an organic solution; and
    adding a plurality of inorganic pellets to the organic solution to form the organic coating around each one of the plurality of inorganic pellets.

3. The method of claim 2, wherein the organic compound is bonded to the plurality of inorganic pellets.

4. The method of claim 2, further comprising planarizing the encapsulant to be level with a top surface of the conductive feature.

5. The method of claim 4, wherein planarizing the encapsulant comprises removing the protective layer from the top surface of the conductive feature.

6. The method of claim 2, wherein treating the conductive feature with the protective material comprises selectively forming the protective layer over the conductive feature.

7. The method of claim 2, wherein the plurality of inorganic pellets comprise a metal oxide.

8. A method, comprising:
    forming a conductive feature over a substrate;
    attaching a semiconductor die to the substrate;
    applying protective pellets along exposed surfaces of the conductive feature, each of the protective pellets comprising an inorganic core and an organic coating;
    forming an encapsulant around the conductive feature and the protective pellets;
    planarizing the encapsulant to be level with a top surface of the semiconductor die; and
    forming an interconnect structure over the conductive feature and the semiconductor die.

9. The method of claim 8, wherein the semiconductor die comprises a conductive element along the top surface of the semiconductor die, and wherein applying the protective pellets along the exposed surfaces of the conductive feature comprises selectively bonding the protective pellets along the conductive feature and the conductive element of the semiconductor die.

10. The method of claim 9, wherein planarizing the encapsulant to be level with the top surface of the semiconductor die comprises removing the protective pellets from the conductive element and from a top surface of the conductive feature.

11. The method of claim 8, wherein the inorganic core comprises a metal oxide.

12. The method of claim 11, wherein the organic coating comprises a first organic compound bonded to the inorganic core.

13. The method of claim 12, wherein the organic coating further comprises a second organic compound bonded to the inorganic core, and wherein some molecules of the first organic compound are bonded to the conductive feature.

14. The method of claim 12, wherein the first organic compound comprises silicon and an amine group.

15. A method, comprising:
    forming a conductive feature over a substrate;
    applying protective pellets over the conductive feature and the substrate, the protective pellets comprising an organic coating disposed around an inorganic core;

performing a water rinse to remove the protective pellets from the substrate, wherein after performing the water rinse, the protective pellets remain attached to the conductive feature; and encapsulating the conductive feature in an encapsulant, the encapsulant forming chemical bonds with first ones of the protective pellets.

16. The method of claim 15, wherein second ones of the protective pellets form chemical bonds with each other.

17. The method of claim 15, further comprising:
forming an organic solution comprising an organic compound and an organic solvent; and
adding the protective pellets to the organic solution to form a protective pellet mixture.

18. The method of claim 17, wherein applying the protective pellets over the conductive feature and the substrate comprises dipping the conductive feature and the substrate into the protective pellets mixture.

19. The method of claim 17, wherein applying the protective pellets over the conductive feature and the substrate comprises spraying the protective pellets mixture over the conductive feature and the substrate.

20. The method of claim 18, wherein forming the organic solution is performed at a temperature of between about 30° C. and about 70° C.

* * * * *